US010861912B2

(12) United States Patent
Guo et al.

(10) Patent No.: US 10,861,912 B2
(45) Date of Patent: Dec. 8, 2020

(54) FLEXIBLE DISPLAY PANEL WITH HARDENED BLOCKS AND DISPLAY DEVICE THEREOF

(71) Applicant: Wuhan China Star Optoelectronics Semiconductor Display Technology Co., Ltd., Wuhan (CN)

(72) Inventors: Qingxun Guo, Wuhan (CN); Shoucheng Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/462,542

(22) PCT Filed: Feb. 19, 2019

(86) PCT No.: PCT/CN2019/075443
§ 371 (c)(1),
(2) Date: May 21, 2019

(87) PCT Pub. No.: WO2020/118892
PCT Pub. Date: Jun. 18, 2020

(65) Prior Publication Data
US 2020/0194519 A1    Jun. 18, 2020

(30) Foreign Application Priority Data

Dec. 15, 2018    (CN) .......................... 2018 1 1537631

(51) Int. Cl.
*H01L 27/32* (2006.01)
*H01L 51/00* (2006.01)
(Continued)

(52) U.S. Cl.
CPC ...... *H01L 27/3246* (2013.01); *H01L 27/3258* (2013.01); *H01L 27/3262* (2013.01); *H01L 27/3276* (2013.01); *H01L 51/0097* (2013.01); *H01L 51/5253* (2013.01); *H01L 51/56* (2013.01); *H01L 27/124* (2013.01); *H01L 27/1218* (2013.01); *H01L 27/1248* (2013.01); *H01L 27/1259* (2013.01); *H01L 2227/323* (2013.01); *H01L 2251/5338* (2013.01)

(58) Field of Classification Search
CPC .................................................. H01L 27/3246
USPC .......................................................... 257/40
See application file for complete search history.

(56) References Cited

U.S. PATENT DOCUMENTS 10,269,830 B1    4/2019  Hu
2006/0279202 A1*  12/2006  Sakamoto ........... H01L 51/5212
                                                          313/504
(Continued)

FOREIGN PATENT DOCUMENTS

CN    106920826    7/2017
CN    107946247    4/2018

*Primary Examiner* — Ajay Arora (57) ABSTRACT

A flexible display panel and a display device are provided. The flexible display panel includes a flexible base and an organic light emitting diode layer. The organic light emitting diode layer is disposed on the flexible base, and the organic light emitting diode layer includes a plurality of sub-pixels disposed at intervals. Hardened blocks are disposed in the organic light emitting diode layer, and the hardened blocks are respectively disposed in the intervals of the sub-pixels spaced apart.

16 Claims, 6 Drawing Sheets

(51) Int. Cl.
*H01L 51/52* (2006.01)
*H01L 51/56* (2006.01)
*H01L 27/12* (2006.01)

(56) References Cited

U.S. PATENT DOCUMENTS

2016/0247861 A1\* 8/2016 Kim .................... H01L 51/5096
2018/0122830 A1 5/2018 Kachatryan et al.

\* cited by examiner

FLEXIBLE DISPLAY PANEL WITH HARDENED BLOCKS AND DISPLAY DEVICE THEREOF

RELATED APPLICATIONS

This application is a National Phase of PCT Patent Application No. PCT/CN2019/075443 having International filing date of Feb. 19, 2019, which claims the benefit of priority of Chinese Patent Application No. 201811537631.1 filed on Dec. 15, 2018. The contents of the above applications are all incorporated by reference as if fully set forth herein in their entirety.

FIELD AND BACKGROUND OF THE INVENTION

The present invention relates to a field of display technologies, especially to a flexible display panel and a display device.

BACKGROUND OF INVENTION

Active matrix organic light emitting diode (AMOLED) display panels include advantages of fast response times, wide gamut, high contrast, wide viewing angles, lower power consumption, foldability, light weight, thinness, simple structures, and low manufacturing costs, and are deemed as one of the most promising products.

At present, there are still many technical barriers to flexible display screens. At the same time, when the screens are bent arbitrarily, assurance of integrity of various functions integrated on the screens and bending resistance become key issues that restrict the development of the flexible display screens.

SUMMARY OF THE INVENTION

Technical Issue

A technical issue to be solved by the present invention is how to prevent a flexible display panel from fracturing to effectively enhance lifespan of the flexible display panel.

Technical Solution

In a first aspect, the present invention provides a flexible display panel, comprising:
a flexible base;
an organic light emitting diode layer, the organic light emitting diode layer disposed on the flexible base, and the organic light emitting diode layer comprising a plurality of sub-pixels disposed at intervals;
wherein hardened blocks are disposed in the organic light emitting diode layer, the hardened blocks are disposed in the intervals of the sub-pixels respectively;
wherein the organic light emitting diode layer comprises: an active layer, a first insulation layer, a gate electrode layer, second insulation layer, a source and drain layer, a planarization layer, an anode layer, an organic light emitting layer and a cathode layer that are disposed on the flexible base and stacked upon one another;
wherein an orthographic projection of the active layer on the flexible base, an orthographic projection of the gate electrode layer on the flexible base, an orthographic projection of the source and drain electrode on the flexible base, an orthographic projection of the anode layer on the flexible base, and an orthographic projection of the cathode layer on the flexible base are between orthographic projections of the hardened blocks on the flexible base;
wherein the hardened blocks are ultraviolet curing resin.

In the flexible display panel of the present invention, adjacent hardened blocks are in a same layer, and the adjacent hardened blocks are in the same layer with the first insulation layer, the second insulation layer or the planarization layer.

In the flexible display panel of the present invention, adjacent hardened blocks are located in different layers, and the hardened blocks are located one of the first insulation layer, the second insulation layer and the planarization layer.

In the flexible display panel of the present invention, the flexible display panel further comprises a wiring layer, the wiring layer is disposed on the organic light emitting diode layer;
wherein the wiring layer is meshed with a mesh structure, wires in the meshed wiring layer are all disposed in the intervals between the sub-pixels, an orthographic projection of the wiring layer on the flexible base coincides with an orthographic projection of the hardened blocks on the flexible base.

In the flexible display panel of the present invention, the hardened blocks comprises some of the hardened blocks disposed in a folding region of the flexible base, and some others of the hardened blocks disposed in non-folding regions of the flexible base; wherein a number of the hardened blocks disposed in the folding region of the flexible base is greater than a number of the hardened blocks disposed in the non-folding regions of the flexible base.

In the flexible display panel of the present invention, the hardened blocks comprises some of the hardened blocks disposed in a folding region of the flexible base, and some others of the hardened blocks disposed in non-folding regions of the flexible base; wherein a number of the hardened blocks disposed in the folding region of the flexible base is equal to a number of the hardened blocks disposed in the non-folding regions of the flexible base.

In the flexible display panel of the present invention, the flexible display panel further comprises an encapsulation layer; wherein the encapsulation layer is disposed between the organic light emitting diode layer and the wiring layer, and the encapsulation layer covers the organic light emitting diode layer.

In a second aspect, the present invention provides a flexible display panel, comprising:
a flexible base;
an organic light emitting diode layer, the organic light emitting diode layer disposed on the flexible base, and the organic light emitting diode layer comprising a plurality of sub-pixels disposed at intervals;
wherein hardened blocks are disposed in the organic light emitting diode layer, the hardened blocks are disposed in the intervals of the sub-pixels respectively.

In the flexible display panel of the present invention, the organic light emitting diode layer comprises:
an active layer, a first insulation layer, a gate electrode layer, second insulation layer, a source and drain layer, a planarization layer, an anode layer, an organic light emitting layer and a cathode layer that are disposed on the flexible base and stacked upon one another;
wherein an orthographic projection of the active layer on the flexible base, an orthographic projection of the gate electrode layer on the flexible base, an orthographic projection of the source and drain electrode on the flexible base, an orthographic projection of the anode layer on the flexible base, and an orthographic projection of the cathode layer on the flexible base are between orthographic projections of the hardened blocks on the flexible base.

In the flexible display panel of the present invention, adjacent hardened blocks are in a same layer, and the adjacent hardened blocks are in the same layer with the first insulation layer, the second insulation layer or the planarization layer.

In the flexible display panel of the present invention, adjacent hardened blocks are located in different layers, and the hardened blocks are located one of the first insulation layer, the second insulation layer and the planarization layer.

In the flexible display panel of the present invention, the flexible display panel further comprises a wiring layer, the wiring layer is disposed on the organic light emitting diode layer;
wherein the wiring layer is meshed with a mesh structure, wires in the meshed wiring layer are all disposed in the intervals between the sub-pixels, an orthographic projection of the wiring layer on the flexible base coincides with an orthographic projection of the hardened blocks on the flexible base.

In the flexible display panel of the present invention, the hardened blocks comprises some of the hardened blocks disposed in a folding region of the flexible base, and some others of the hardened blocks disposed in non-folding regions of the flexible base; wherein a number of the hardened blocks disposed in the folding region of the flexible base is greater than a number of the hardened blocks disposed in the non-folding regions of the flexible base.

In the flexible display panel of the present invention, the hardened blocks comprises some of the hardened blocks disposed in a folding region of the flexible base, and some others of the hardened blocks disposed in non-folding regions of the flexible base; wherein a number of the hardened blocks disposed in the folding region of the flexible base is equal to a number of the hardened blocks disposed in the non-folding regions of the flexible base.

In the flexible display panel of the present invention, the flexible display panel further comprises an encapsulation layer; wherein the encapsulation layer is disposed between the organic light emitting diode layer and the wiring layer, and the encapsulation layer covers the organic light emitting diode layer.

In the flexible display panel of the present invention, material of the hardened blocks are ultraviolet curing resin.

In a third aspect, the present invention provides a display device, comprising a flexible display panel;
    wherein the flexible display panel comprises:
    a flexible base; and
    an organic light emitting diode layer, the organic light emitting diode layer disposed on the flexible base, and the organic light emitting diode layer comprising a plurality of sub-pixels disposed at intervals;
    wherein hardened blocks are disposed in the organic light emitting diode layer, the hardened blocks are disposed in the intervals of the sub-pixels respectively.

In the display device of the present invention, the organic light emitting diode layer comprises:
    an active layer, a first insulation layer, a gate electrode layer, second insulation layer, a source and drain layer, a planarization layer, an anode layer, an organic light emitting layer and a cathode layer that are disposed on the flexible base and stacked upon one another;
    wherein an orthographic projection of the active layer on the flexible base, an orthographic projection of the gate electrode layer on the flexible base, an orthographic projection of the source and drain electrode on the flexible base, an orthographic projection of the anode layer on the flexible base, and an orthographic projection of the cathode layer on the flexible base are between orthographic projections of the hardened blocks on the flexible base.

In the display device of the present invention, adjacent hardened blocks are in a same layer, and the adjacent hardened blocks are in the same layer with the first insulation layer, the second insulation layer or the planarization layer.

In the display device of the present invention, adjacent hardened blocks are located in different layers, and the hardened blocks are located one of the first insulation layer, the second insulation layer and the planarization layer.

Advantages

Advantages of the present invention: by disposing the hardened blocks in the organic light emitting diode layer and disposing the hardened blocks at the intervals among a plurality of sub-pixels, flexible display panel can be prevented from fracture, which effectively improves lifespan of the flexible display panel.

DESCRIPTION OF SPECIFIC EMBODIMENTS OF THE INVENTION

Embodiments of the present invention will be described in details as follows. The examples of the embodiments are shown in the drawings, in which like reference numerals are used to refer to the same or similar elements or elements that have the same or similar functions. The embodiments described in the drawings are illustrative and are only used to explain the present invention, and are not to be construed as limiting the present invention.

Figure 1:
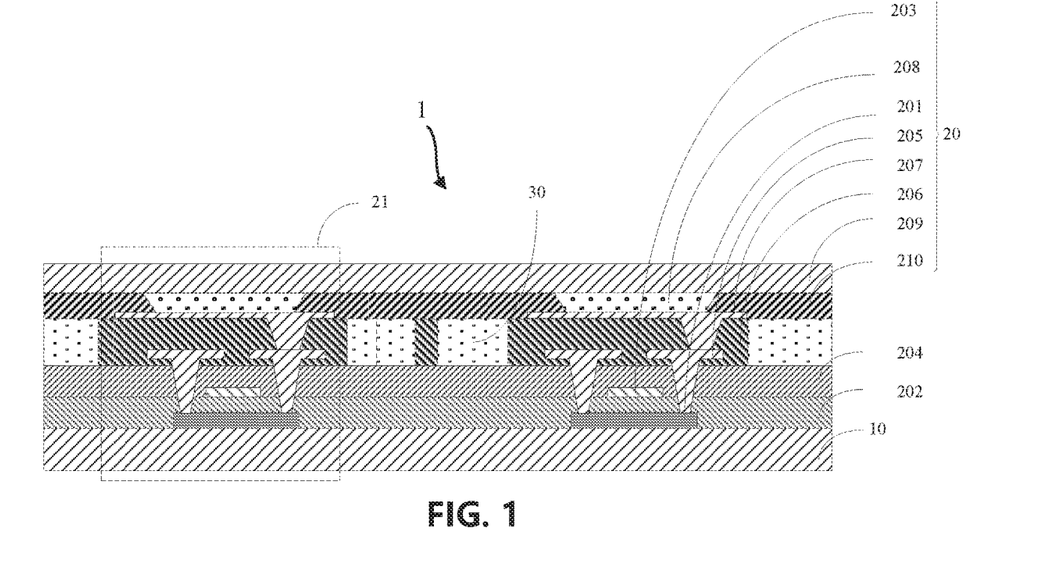
FIG. 1 is a schematic structural view of a flexible display panel provided by a first embodiment of the present invention.

With reference to FIG. 1, FIG. 1 is a schematic structural view of a flexible display panel provided by a first embodiment of the present invention.

The present invention provides a flexible display panel 1 including a flexible base 10 and an organic light emitting diode layer 20. The organic light emitting diode layer 20 is disposed on the flexible base 10. The organic light emitting diode layer 20 includes a plurality of sub-pixels 21 disposed at intervals. Hardened blocks 30 are disposed in the organic light emitting diode layer 20. The hardened blocks 30 are respectively disposed in the intervals between the sub-pixels 21 disposed at the intervals.

Material of the flexible base 10 can be polyimide (PI). Material of the hardened blocks 30 can be ultraviolet curing resin. The ultraviolet curing resin can be acryloxy, methacryloxy, vinyl, or allyl. Disposing the hardened blocks 30 in the organic light emitting diode layer 20 can enhance bending resistance of the organic light emitting diode layer 20 to prevent fracture of some bent film layers in the organic light emitting diode layer 20 that causes failure of the flexible display panel 1 when the flexible base 10 is bent.

The organic light emitting diode layer 20 can include: an active layer 201, a first insulation layer 202, a gate electrode layer 203, a second insulation layer 204, a source and drain layer 205, a planarization layer 206, an anode layer 207, an organic light emitting layer 208, and a cathode layer 209 that are stacked on one another on over the flexible base 10, and a pixel definition layer 210 disposed between the anode layer 207 and the cathode layer 209. The pixel definition layer 210 is configured to define pixels, and covers at least one portion of the anode layer 207.

An orthographic projection of the active layer 201 on the flexible base 10, an orthographic projection of the gate electrode layer 203 on the flexible base 10, an orthographic projection of the source and drain electrode 205 on the flexible base 10, an orthographic projection of the anode layer 207 on the flexible base 10, and an orthographic projection of the cathode layer 209 on the flexible base 10 are all located between orthographic projections of the hardened blocks 30 on the flexible base 10. In other words, the hardened blocks 30 are only disposed in the first insulation layer 202, the second insulation layer 204, the planarization layer 206, or the pixel definition layer 210. Thus, light emitting capability of the flexible display panel 1 can be assured and bending resistance of the flexible display panel 1 can be provided to further enhance a lifespan of the flexible display panel 1.

There are many ways for disposing the hardened blocks 30 in the organic light emitting diode layer 20. For example, after the flexible base 10 is formed on the planarization layer 206, by an etching process, portions of the planarization layer 206 respectively disposed in intervals of the sub-pixels 21 are etched. Then, etched places are filled with ultraviolet curing resin. Then, ultraviolet irradiation is implemented on the ultraviolet curing resin based on an ultraviolet curing characteristic such that the resin is cured. After curing, the hardened blocks 30 with bending resistance of the flexible display panel 1 is acquired.

In an embodiment, adjacent hardened blocks 30 are located in a same layer, and the adjacent hardened blocks 30 are located in the same layer with the first insulation layer 202, the second insulation layer 204, or the planarization layer 206.

Figure 2:
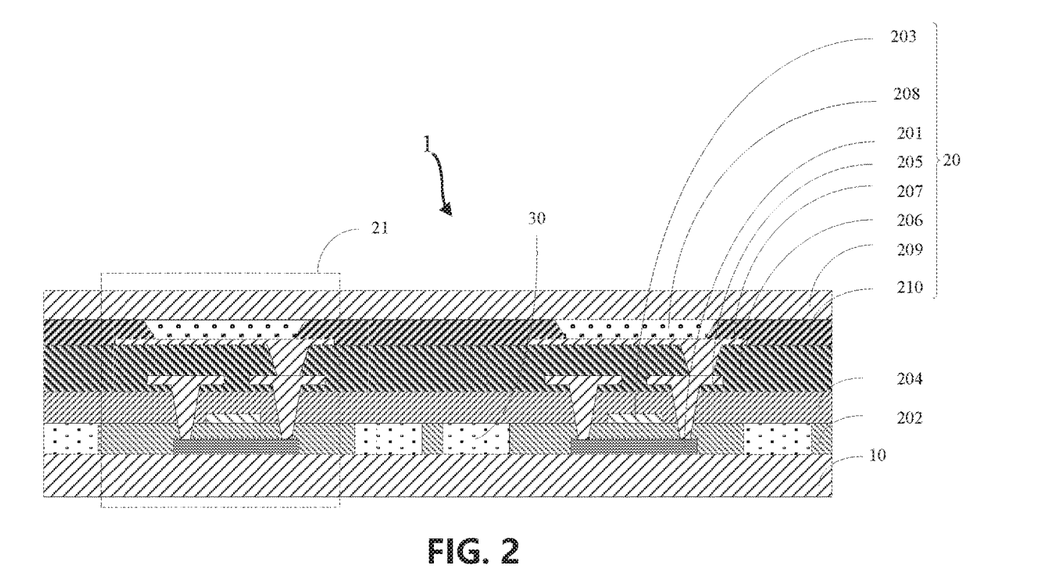
FIG. 2 is a schematic structural view of the flexible display panel provided by a second embodiment of the present invention.

For example, the hardened blocks 30 and the planarization layer 206 are in the same layer, as shown in FIG. 1. In a specific embodiment, after the planarization layer 206 is formed, by an etching process, portions of the planarization layer 206 respectively disposed in the intervals of the sub-pixels 21 are etched. Then, the etched places are filled with ultraviolet curing resin. Then, ultraviolet irradiation is implemented on the ultraviolet curing resin based on an ultraviolet curing characteristic such that the resin is cured and hardened blocks 30 are obtained. For example, alternatively, the adjacent hardened blocks 30 and the first insulation layer 202 are located in the same layer, as shown in FIG. 2. In a specific embodiment, after the first insulation layer 202 is formed, by an etching process, portions of the first insulation layer 202 respectively disposed in the intervals of the sub-pixels 21 are etched. Then, the etched places are filled with ultraviolet curing resin. Then, ultraviolet irradiation is implemented on the ultraviolet curing resin based on an ultraviolet curing characteristic such that the resin is cured and hardened blocks 30 are obtained.

Figure 3:
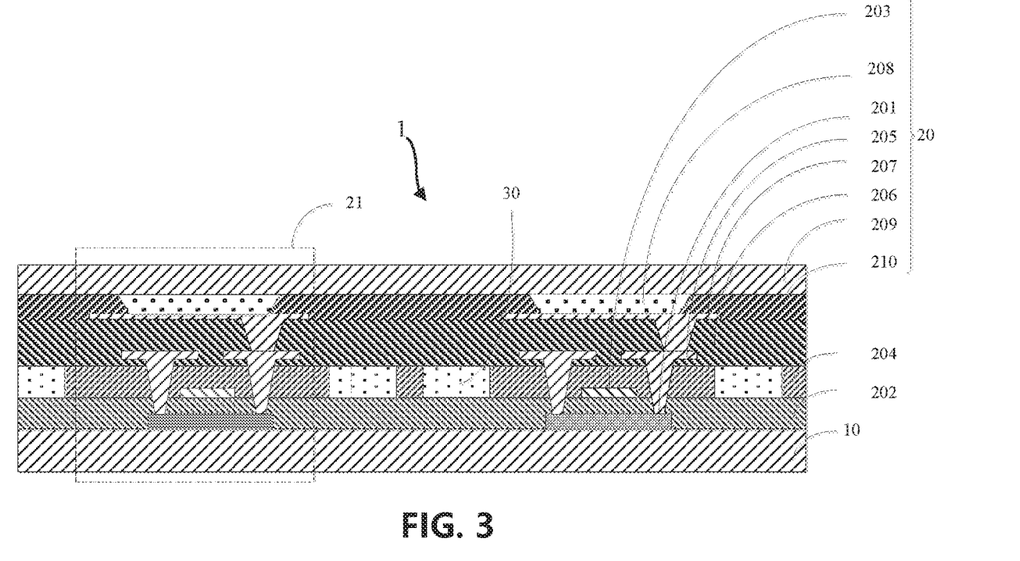
FIG. 3 is a schematic structural view of the flexible display panel provided by a third embodiment of the present invention.
Figure 4:
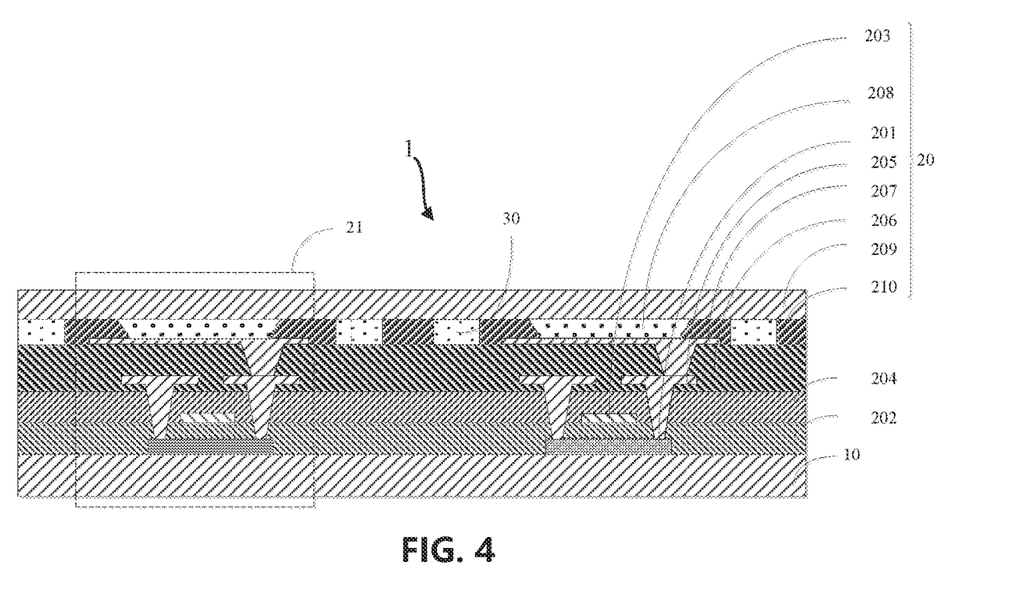
FIG. 4 is a schematic structural view of the flexible display panel provided by a fourth embodiment of the present invention.

For example, the adjacent hardened blocks 30 and the second insulation layer 204 are in the same layer, as shown in FIG. 3. In a specific embodiment, after the second insulation layer 204 is formed, by an etching process, portions of the second insulation layer 204 respectively disposed in the intervals of the sub-pixels 21 are etched. Then, the etched places are filled with ultraviolet curing resin. Then, ultraviolet irradiation is implemented on the ultraviolet curing resin based on an ultraviolet curing characteristic such that the resin is cured to acquire hardened blocks 30.

Furthermore, for example, the adjacent hardened blocks 30 and the pixel definition layer 210 are located in the same layer, as shown in FIG. 3. In a specific embodiment, after the pixel definition layer 210 is formed, by an etching process, portions of the pixel definition layer 210 respectively disposed in the intervals of the sub-pixels 21 are etched. Then, the etched places are filled with ultraviolet curing resin. Then, ultraviolet irradiation is implemented on the ultraviolet curing resin based on an ultraviolet curing characteristic such that the resin is cured to acquire hardened blocks 30.

In another embodiment, the adjacent hardened blocks 30 are located in different layers, and the hardened blocks are located in the first insulation layer 202, the second insulation layer 204, or the planarization layer 206.

Figure 5:
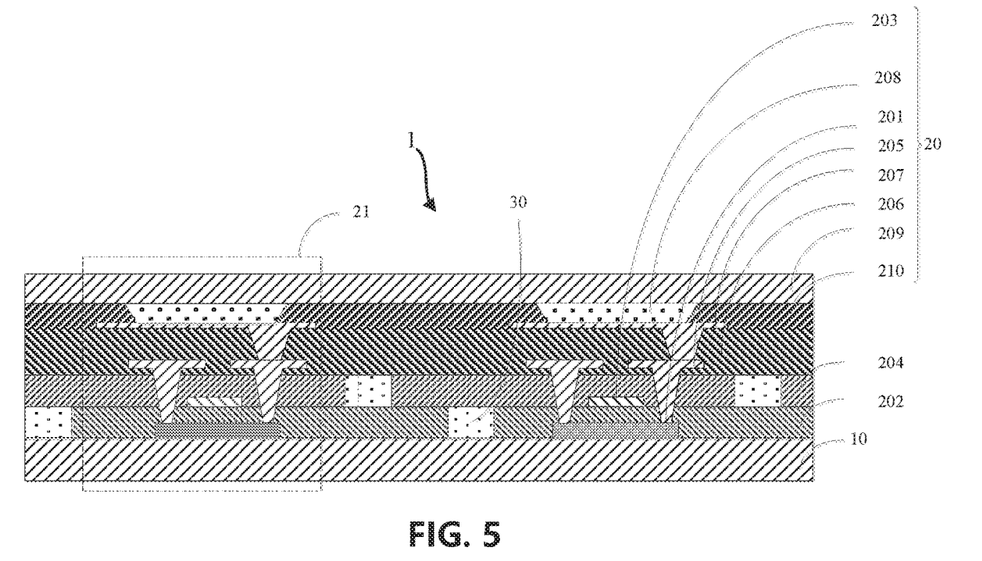
FIG. 5 is a schematic structural view of the flexible display panel provided by a fifth embodiment of the present invention.
Figure 6:
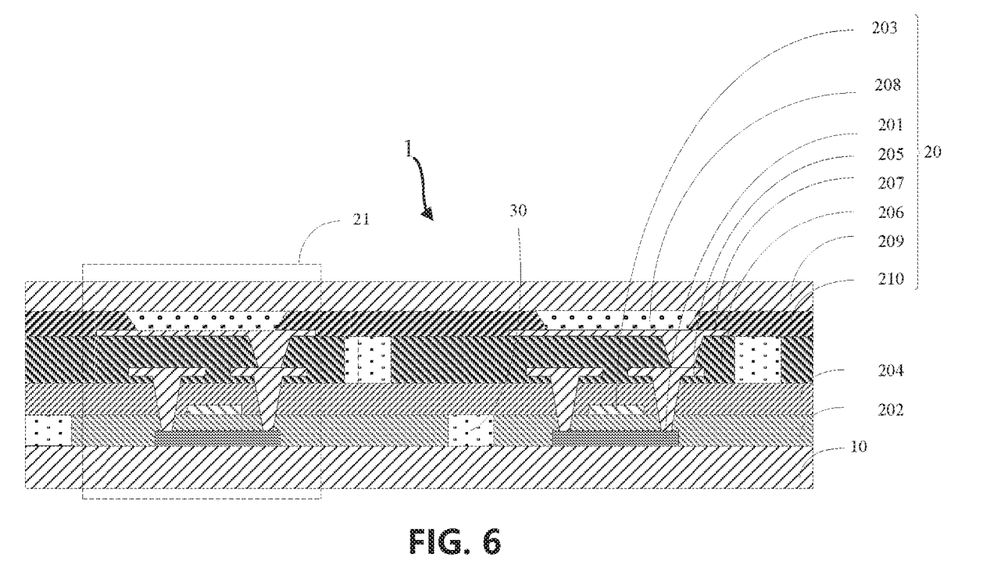
FIG. 6 is a schematic structural view of the flexible display panel provided by a sixth embodiment of the present invention.

For example, one hardened block 30 is located in the first insulation layer 202, and another hardened blocks 30 is located in the second insulation layer 204, as shown in FIG. 5. Alternatively, for example, one hardened block 30 is located in the first insulation layer 202, and another hardened blocks 30 is located in planarization layer 206, as shown in FIG. 6. Specific disposing method is referred to the above embodiment. Furthermore, the present embodiment only illustrates two example for description instead of limiting the present invention. Specific setting is made according to actual conditions. It is to be satisfied that the hardened blocks 30 are in different layers and the hardened blocks are located in the first insulation layer 202, the second insulation layer 204, or the planarization layer 206.

The hardened blocks 30 are disposed in the first insulation layer 202, the second insulation layer 204, or the planarization layer 206, and the hardened blocks 30 are disposed in the intervals of the sub-pixels 21 spaced apart, which can prevent fracture of the flexible display panel 1 to effectively improve a lifespan of the flexible display panel 1.

Figure 7:
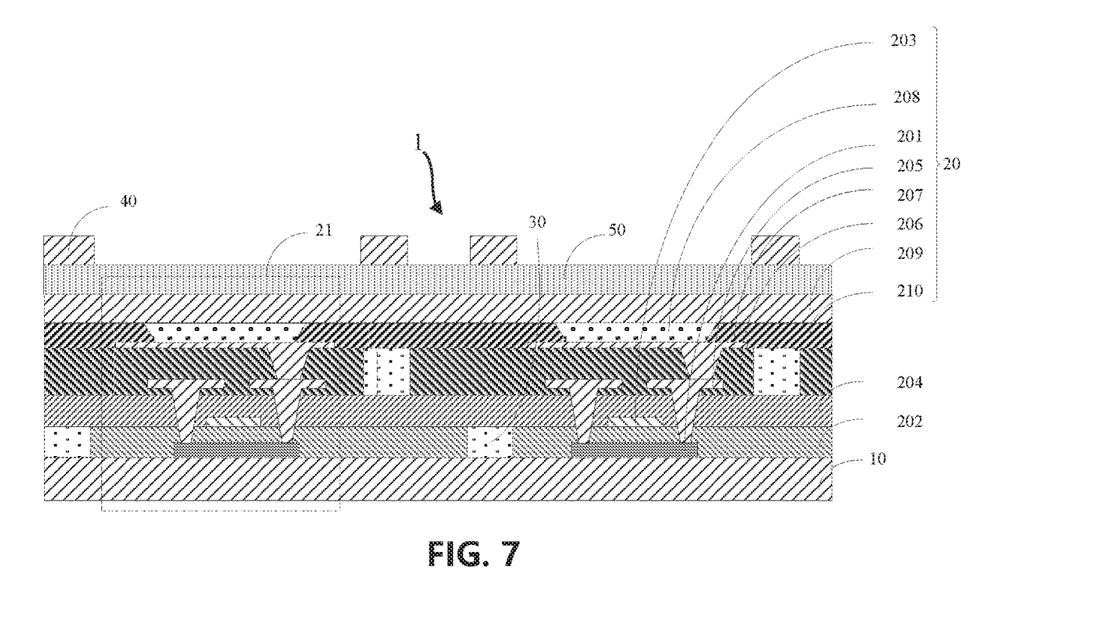
FIG. 7 is a schematic structural view of the flexible display panel provided by a seventh embodiment of the present invention.

With reference to FIG. 7, FIG. 7 is a schematic structural view of a seventh embodiment of the flexible display panel provided by present invention. The present invention provides a flexible display panel 1. A difference of the flexible display panel 1 in FIG. 7 from the flexible display panel 1 in FIG. 1 is that the flexible display panel 1 further includes a wiring layer 40. The wiring layer 40 is disposed on the organic light emitting diode layer 20. The wiring layer 40 is a mesh structure, wires in the meshed wiring layer 40 are all disposed in the intervals between the sub-pixels 21, an orthographic projection of the wiring layer 20 on the flexible base 10 coincides with an orthographic projection of the hardened blocks 30 on the flexible base 10.

In the embodiment, first, the hardened blocks 30 are disposed on the organic light emitting diode layer 20, and the hardened blocks 30 are disposed in the intervals of the sub-pixels 21 spaced apart such that fracture of the flexible display panel 1 can be prevented to effectively improve lifespan of the flexible display panel 1. Then, the wiring layer 40 disposed on the organic light emitting diode layer 20 are patterned to form a wiring layer 40 including a mesh structure. The wires in the meshed wiring layer 40 are disposed the intervals of the sub-pixels 21 respectively. Such a patterning design can extremely increase bending resistance of the wiring layer 40, which greatly improves the lifespan of the flexible display panel 1. Second, it can also facilitate light emission of the sub-pixels 21, which increases brightness of the flexible display panel 1.

With further reference to FIG. 7, the flexible display panel 1 further comprises an encapsulation layer 50. The encapsulation layer 50 is disposed between the organic light emitting diode layer 20 and the wiring layer 40, and the encapsulation layer 50 covers the organic light emitting diode layer 20. After the manufacturing process of the organic light emitting diode layer 20 is completed, the encapsulation layer 50 is manufactured on the organic light emitting diode layer 20. The encapsulation layer 50 is configured to protect an organic material in the organic light emitting diode layer 20 to prevent the organic material in the organic light emitting diode layer 20 from contacting water oxygen in the air that results in failure of the flexible display panel 1, which further improves the lifespan of the flexible display panel 1.

Figure 8:
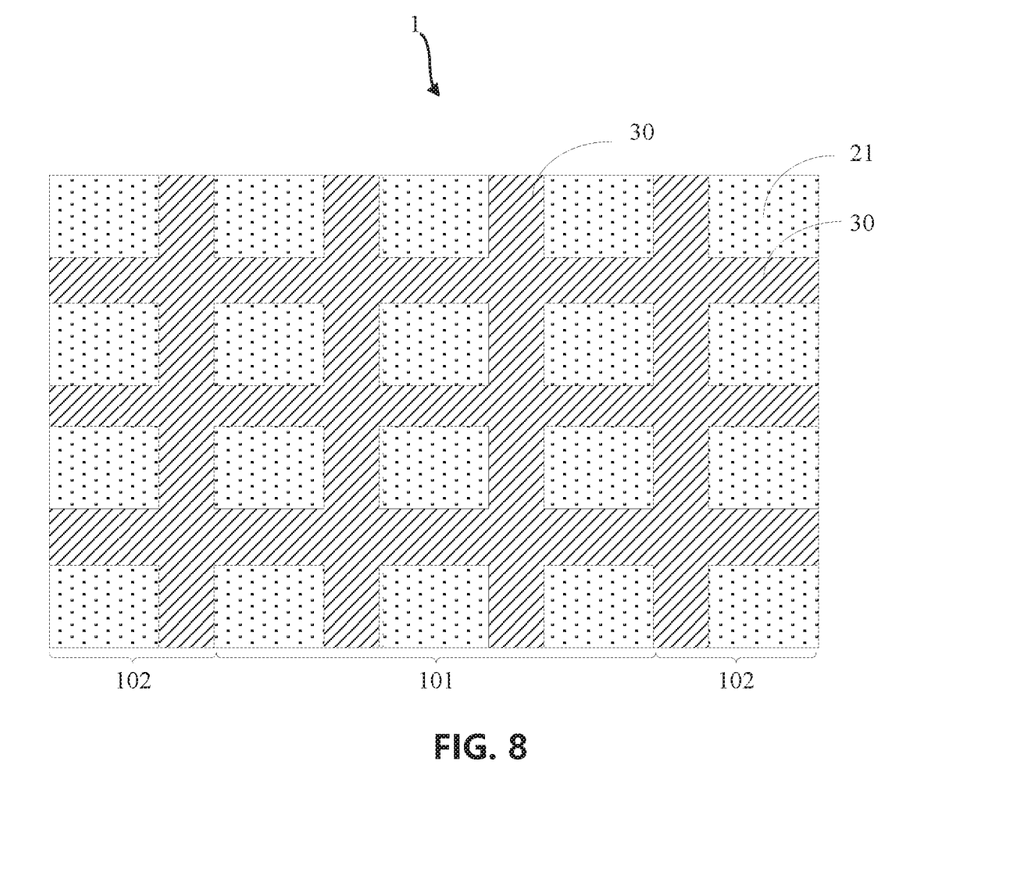
FIG. 8 is a schematic plan view of the flexible display panel provided by the first embodiment of the present invention.

With reference to FIG. 8, FIG. 8 is a schematic plan view of the flexible display panel provided by the first embodiment of the present invention. The present invention provides a flexible display panel 1. The flexible base 10 includes a folding region 101 and a non-folding regions 102. The hardened blocks 30 include a plurality of the hardened blocks 30 disposed in the folding region 101 of the flexible base 10 and a plurality of the hardened blocks 30 disposed in the non-folding regions 102 of the flexible base 10. A number of the hardened blocks 30 disposed in the folding region 101 of the flexible base 10 is equal to a number of the hardened blocks 30 disposed in the non-folding regions 102 of the flexible base 10.

Therefore, setting the number of the hardened blocks 30 in the folding region 101 to be greater than the number of the hardened blocks 30 in the non-folding regions 102 can make pressure on the folding region 101 and the non-folding regions 102 even and facilitate an engineering design, which increases the production rate of the flexible display panel 1.

Figure 9:
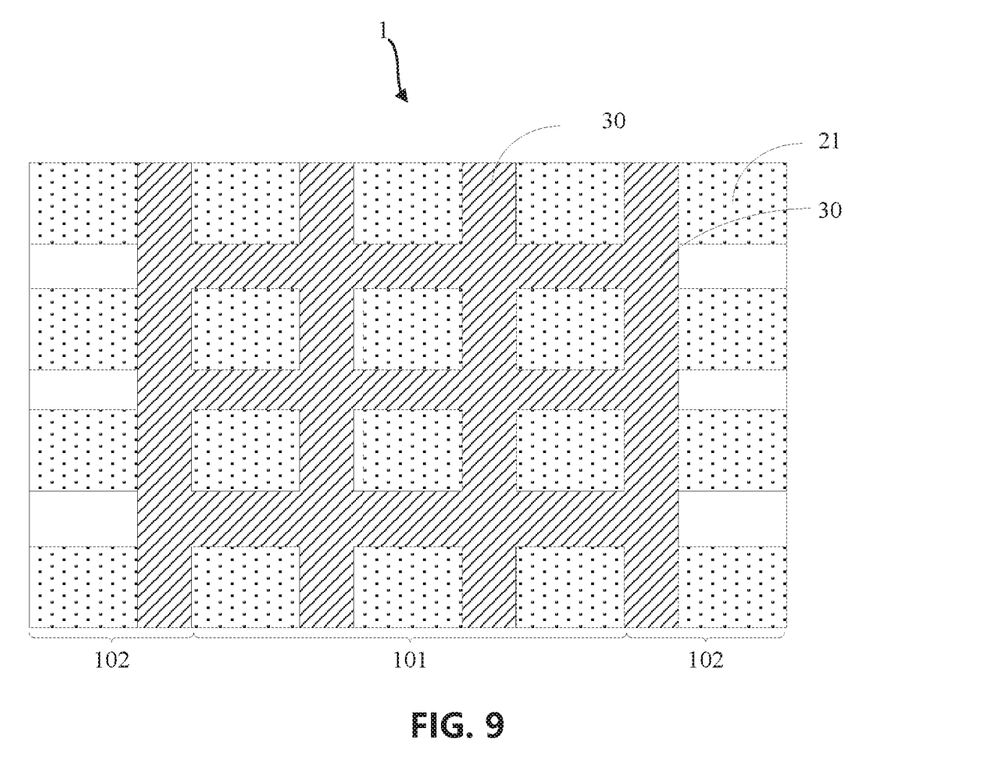
FIG. 9 is a schematic plan view of the flexible display panel provided by the second embodiment of the present invention.

With reference to FIG. 9, FIG. 9 is a schematic plan view of the flexible display panel provided by the second embodiment of the present invention. The present invention provides a flexible display panel 1. A difference of the flexible display panel 1 in FIG. 9 from the flexible display panel 1 in FIG. 8 is that a number of the hardened blocks 30 disposed in the folding region 101 of the flexible base 10 is greater than a number of the hardened blocks 30 disposed in the non-folding regions 102 of the flexible base 10.

Pressure on the folding region 101 of the flexible display panel 1 is greater than pressure on non-folding regions 102. Therefore, setting the number of the hardened blocks 30 disposed in the folding region 101 to be greater than the number of the hardened blocks 30 disposed in the non-folding regions 102 can improve bending resistance of the folding region 101 of the flexible display panel 1.

Correspondingly, the present invention also provides a display device, including the flexible display panel 1 of any one of the embodiments of the present invention.

The flexible display panel and the display device provided by the embodiments of the present invention are described in detail. In this paper, the specific examples are used to explain the principle and implementation of the present invention. The description of the above disclosure is only used to help understand the present invention. At the same time, a person skilled in the art, according to the idea of the present invention, will have some changes in the specific embodiments and application extent. In summary, the contents of this specification should not be construed as limiting the present invention.

What is claimed is:

1. A flexible display panel, comprising:
a flexible base;
an organic light emitting diode layer, the organic light emitting diode layer disposed on the flexible base, and the organic light emitting diode layer comprising a plurality of sub-pixels disposed at intervals;
wherein hardened blocks are disposed in the organic light emitting diode layer, the hardened blocks are disposed in the intervals of the sub-pixels respectively;
wherein the organic light emitting diode layer comprises an active layer, a first insulation layer, a gate electrode layer, a second insulation layer, a source and drain layer, a planarization layer, an anode layer, an organic light emitting layer, and a cathode layer that are disposed on the flexible base and stacked upon one another;
wherein an orthographic projection of the active layer on the flexible base, an orthographic projection of the gate electrode layer on the flexible base, an orthographic projection of the source and drain electrode on the flexible base, an orthographic projection of the anode layer on the flexible base, and an orthographic projection of the cathode layer on the flexible base are between orthographic projections of the hardened blocks on the flexible base;
wherein the hardened blocks are ultraviolet curing resin;
wherein the hardened blocks comprises some of the hardened blocks disposed in a folding region of the flexible base, and some others of the hardened blocks disposed in non-folding regions of the flexible base;
wherein a number of the hardened blocks disposed in the folding region of the flexible base is greater than a number of the hardened blocks disposed in the non-folding regions of the flexible base.

2. The flexible display panel as claimed in claim 1, wherein adjacent hardened blocks are in a same layer, and the adjacent hardened blocks are in the same layer with the first insulation layer, the second insulation layer or the planarization layer.

3. The flexible display panel as claimed in claim 1, wherein adjacent hardened blocks are located in different layers, and the hardened blocks are located one of the first insulation layer, the second insulation layer and the planarization layer.

4. The flexible display panel as claimed in claim 1, wherein the flexible display panel further comprises a wiring layer, the wiring layer is disposed on the organic light emitting diode layer;
wherein the wiring layer is meshed with a mesh structure, wires in the meshed wiring layer are all disposed in the intervals between the sub-pixels, an orthographic projection of the wiring layer on the flexible base coincides with an orthographic projection of the hardened blocks on the flexible base.

5. The flexible display panel as claimed in claim 4, wherein the flexible display panel further comprises an encapsulation layer; wherein the encapsulation layer is disposed between the organic light emitting diode layer and the wiring layer, and the encapsulation layer covers the organic light emitting diode layer.

6. A flexible display panel, comprising:
a flexible base;
an organic light emitting diode layer, the organic light emitting diode layer disposed on the flexible base, and the organic light emitting diode layer comprising a plurality of sub-pixels disposed at intervals;
wherein hardened blocks are disposed in the organic light emitting diode layer, the hardened blocks are disposed in the intervals of the sub-pixels respectively;
wherein the hardened blocks comprises some of the hardened blocks disposed in a folding region of the flexible base, and some others of the hardened blocks disposed in non-folding regions of the flexible base; wherein a number of the hardened blocks disposed in the folding region of the flexible base is greater than a number of the hardened blocks disposed in the non-folding regions of the flexible base.

7. The flexible display panel as claimed in claim 6, wherein the organic light emitting diode layer comprises:
an active layer, a first insulation layer, a gate electrode layer, a second insulation layer, a source and drain layer, a planarization layer, an anode layer, an organic light emitting layer, and a cathode layer that are disposed on the flexible base and stacked upon one another;
wherein an orthographic projection of the active layer on the flexible base, an orthographic projection of the gate electrode layer on the flexible base, an orthographic projection of the source and drain electrode on the flexible base, an orthographic projection of the anode layer on the flexible base, and an orthographic projection of the cathode layer on the flexible base are between orthographic projections of the hardened blocks on the flexible base.

8. The flexible display panel as claimed in claim 7, wherein adjacent hardened blocks are in a same layer, and the adjacent hardened blocks are in the same layer with the first insulation layer, the second insulation layer or the planarization layer.

9. The flexible display panel as claimed in claim 7, wherein adjacent hardened blocks are located in different layers, and the hardened blocks are located one of the first insulation layer, the second insulation layer, and the planarization layer.

10. The flexible display panel as claimed in claim 6, wherein the flexible display panel further comprises a wiring layer, the wiring layer is disposed on the organic light emitting diode layer;
wherein the wiring layer is meshed with a mesh structure, wires in the meshed wiring layer are all disposed in the intervals between the sub-pixels, an orthographic projection of the wiring layer on the flexible base coincides with an orthographic projection of the hardened blocks on the flexible base.

11. The flexible display panel as claimed in claim 10, wherein the flexible display panel further comprises an encapsulation layer; wherein the encapsulation layer is disposed between the organic light emitting diode layer and the wiring layer, and the encapsulation layer covers the organic light emitting diode layer.

12. The display panel as claimed in claim 6, wherein material of the hardened blocks is ultraviolet curing resin.

13. A display device, comprising a flexible display panel;
wherein the flexible display panel comprises:
a flexible base; and
an organic light emitting diode layer, the organic light emitting diode layer disposed on the flexible base, and the organic light emitting diode layer comprising a plurality of sub-pixels disposed at intervals;
wherein hardened blocks are disposed in the organic light emitting diode layer, the hardened blocks are disposed in the intervals of the sub-pixels respectively;
wherein the hardened blocks comprises some of the hardened blocks disposed in a folding region of the flexible base, and some others of the hardened blocks disposed in non-folding regions of the flexible base; wherein a number of the hardened blocks disposed in the folding region of the flexible base is greater than a number of the hardened blocks disposed in the non-folding regions of the flexible base.

14. The display device as claimed in claim 13, wherein the organic light emitting diode layer comprises:
an active layer, a first insulation layer, a gate electrode layer, a second insulation layer, a source and drain layer, a planarization layer, an anode layer, an organic light emitting layer, and a cathode layer that are disposed on the flexible base and stacked upon one another;
wherein an orthographic projection of the active layer on the flexible base, an orthographic projection of the gate electrode layer on the flexible base, an orthographic projection of the source and drain electrode on the flexible base, an orthographic projection of the anode layer on the flexible base, and an orthographic projection of the cathode layer on the flexible base are between orthographic projections of the hardened blocks on the flexible base.

15. The display device as claimed in claim 14, wherein adjacent hardened blocks are in a same layer, and the adjacent hardened blocks are in the same layer with the first insulation layer, the second insulation layer or the planarization layer.

16. The display device as claimed in claim 14, wherein adjacent hardened blocks are located in different layers, and the hardened blocks are located one of the first insulation layer, the second insulation layer, and the planarization layer.

* * * * *